United States Patent
Bock et al.

(10) Patent No.: US 12,200,872 B2
(45) Date of Patent: *Jan. 14, 2025

(54) CONTROL DEVICE FOR A MOTOR VEHICLE

(71) Applicant: Vitesco Technologies Germany GmbH, Hannover (DE)

(72) Inventors: Johannes Bock, Kirchensittenbach (DE); Johannes Brunner, Erlangen (DE); Christian Walda, Forchheim (DE); Karin Beart, Beart (DE); Jens Heinrich, Sinzing (DE)

(73) Assignee: Vitesco Technologies Germany GmbH, Regensburg (DE)

( * ) Notice: Subject to any disclaimer, the term of this patent is extended or adjusted under 35 U.S.C. 154(b) by 392 days.

This patent is subject to a terminal disclaimer.

(21) Appl. No.: 17/654,189

(22) Filed: Mar. 9, 2022

(65) Prior Publication Data

US 2022/0201868 A1 Jun. 23, 2022

Related U.S. Application Data

(63) Continuation of application No. PCT/EP2020/074338, filed on Sep. 1, 2020.

(30) Foreign Application Priority Data

Sep. 11, 2019 (DE) ...................... 10 2019 213 893.4
Sep. 17, 2019 (DE) ...................... 10 2019 214 150.1

(51) Int. Cl.
*H05K 3/28* (2006.01)
*H05K 5/00* (2006.01)

(52) U.S. Cl.
CPC ............. *H05K 3/284* (2013.01); *H05K 3/282* (2013.01); *H05K 5/0034* (2013.01); *H05K 2203/1316* (2013.01); *H05K 2203/1327* (2013.01)

(58) Field of Classification Search
CPC ...... H05K 3/284; H05K 3/282; H05K 5/0034; H05K 2203/136; H05K 2203/1327
(Continued)

(56) References Cited

U.S. PATENT DOCUMENTS

2006/0281230 A1    12/2006   Brandenburg
2015/0208541 A1*   7/2015    Loibl .................. H05K 5/0213
                                                           361/752

(Continued)

FOREIGN PATENT DOCUMENTS

DE          4113606 C1    8/1992
DE     102013204014 A1    9/2014
(Continued)

OTHER PUBLICATIONS

International Search Report and Written Opinion dated Nov. 30, 2020 from corresponding International Patent Application No. PCT/EP2020/074338.
(Continued)

*Primary Examiner* — Andargie M Aychillhum

(57) ABSTRACT

A control device for a motor vehicle is provided. The control device includes a printed circuit board having a first side and an edge. The first side of the printed circuit board is delimited by the edge. The control device includes at least one electronic component arranged on the first side of the printed circuit board and electrically conductively connected to the printed circuit board). The control device also includes a first conductor loop formed as a resistor and arranged on the first side of the printed circuit board. The first conductor (Continued)

loop is arranged between the edge and the electronic component. The control device also includes an encapsulation of the printed circuit board. The encapsulation surrounds at least the first side, the at least one electronic component and the first conductor loop.

10 Claims, 3 Drawing Sheets

(58) Field of Classification Search
USPC .......................................................... 174/260
See application file for complete search history.

(56) References Cited

U.S. PATENT DOCUMENTS

2016/0343498 A1    11/2016  Lee
2018/0116078 A1*  4/2018  Mun ...................... H05K 1/111

FOREIGN PATENT DOCUMENTS

| DE | 202015100678 U1 | 2/2015 |
| DE | 102015208818 A1 | 11/2016 |
| EP | 1734800 A2 | 12/2006 |
| JP | 2005236586 A | 9/2005 |

OTHER PUBLICATIONS

Chinese Office Action dated Aug. 21, 2024 for corresponding Patent Application No. 202080063855.2.

* cited by examiner

CONTROL DEVICE FOR A MOTOR VEHICLE

CROSS-REFERENCE TO RELATED APPLICATIONS

This application claims the benefit of PCT Application PCT/EP2020/074338, filed Sep. 1, 2020, which claims priority to German Application 10 2019 214 150.1, filed Sep. 17, 2019 and German Application 10 2019 213 893.4, filed Sep. 11, 2019. The disclosures of the above applications are incorporated herein by reference.

TECHNICAL FIELD

The disclosure relates to a control device for a motor vehicle. The control device has an encapsulated or overmolded printed circuit board and a conductor loop which is formed as a resistor is formed on the printed circuit board. A leakage point between the encapsulation and the printed circuit board can be detected by a resistance measurement on the conductor loop.

BACKGROUND

Control devices which have a housing are known, and a printed circuit board is arranged inside the housing. Control devices of this kind can exhibit increased tightness due to the housing. In the course of weight savings and to reduce component dimensions, control devices or their printed circuit boards are encapsulated with a plastic and are therefore also designed to be media-tight. However, if the adhesive bond between the printed circuit board and the encapsulation weakens, a gap can form between the printed circuit board and the encapsulation. A corrosive medium, for example an oil, can enter through this gap and damage contacts of the electronic components which are arranged on the printed circuit board, as a result of which the control device can suddenly and expectedly fail.

SUMMARY

The disclosure provides a control device for a motor vehicle, the tightness of the control device can be monitored in a simple manner.

The control device for the motor vehicle includes a printed circuit board having a first side and an edge. The first side of the printed circuit board is delimited by the edge. The control device also includes at least one electronic component arranged on the first side of the printed circuit board and electrically conductively connected to the printed circuit board. The control device also includes a first conductor loop arranged on the first side of the printed circuit board. The first conductor loop is arranged between the edge and the electronic component. The control device also includes an encapsulation of the printed circuit board, where the encapsulation surrounds and/or encloses at least the first side of the at least one electronic component and the first conductor loop.

One aspect of the disclosure provides a control device for a motor vehicle. The control device has at least one printed circuit board. The printed circuit board has a first side. This first side is usually also referred to as the top side. The printed circuit board additionally has an edge which delimits the first side of the printed circuit board. The edge can therefore also be referred to as a border. The edge therefore represents an outer termination of the printed circuit board.

At least one electronic component is arranged on the first side of the printed circuit board and is electrically conductively connected to the printed circuit board. The first side generally has a plurality of electronic components which are arranged at a distance from one another on the first side. The components are usually also referred to as an electronic module.

Furthermore, it is provided that a first conductor loop which is formed as a resistor is arranged on the first side of the printed circuit board, where the first conductor loop is arranged between the edge and the electronic component. In other words, a distance in a plane parallel to the printed circuit board between the first conductor loop and the edge is smaller than between the electronic component and the edge.

The first side of the printed circuit board is encapsulated. The encapsulation of the printed circuit board is also referred to as "overmolding". The encapsulation is formed in such a way that it surrounds at least the electronic component and the first conductor loop. If the adhesive bond between the encapsulation and the printed circuit board is then weakened, so that a small gap forms between the encapsulation and the printed circuit board, a corrosive medium, for example an oil, can enter the gap and cause corrosion of the first conductor loop. As a result of the corrosion of the first conductor loop, the resistance of the first conductor loop changes. Specifically, the resistance of the first conductor loop increases. Since the distance between the edge and the conductor loop is smaller than between the edge and the electronic component, a defect in the adhesive bond between the encapsulation and the printed circuit board can be detected and indicated before the electronic components which are important for the operation of the control device are damaged by the ingress of the corrosive medium. In this way, a control device is provided, the tightness of which can be monitored in a simple manner.

One advantageous development of the disclosure is that the first conductor loop is open and is wired by a through-plating for a four-point resistance measurement. In other words, the first conductor loop is arranged on the first side of the printed circuit board. The measuring points of the first conductor loop are routed from the first side to a second side which is arranged at a distance from the first side by the through-plating through the printed circuit board. In this way, the resistance of the first conductor loop can be measured from the second side, so that the encapsulation on the first side of the printed circuit board is not interrupted and thus weakened by the contact arrangement for measuring the resistance of the first conductor loop.

One advantageous development of the disclosure is that the printed circuit board has a second side which is arranged at a distance from the first side and is delimited by the edge, and a second conductor loop is arranged at a distance from the edge on the second side. The second side is generally also referred to as the bottom side. The second side is arranged opposite the first side. The second conductor loop which is arranged on the second side is open and has four contact points for a four-point resistance measurement. The resistance of the second conductor loop can be measured separately from the first conductor loop via the second conductor loop, so that a defect can first be detected depending on the point at which the adhesive bond between the encapsulation and the printed circuit board gives way.

In principle, it can be provided that both the first side and the second side of the printed circuit board are encapsulated. In other words, it can be provided that the first conductor loop is encapsulated or overmolded on the first side of the printed circuit board, and the second conductor loop is likewise encapsulated or overmolded on the second side of the printed circuit board. The material for encapsulating the first side and the second side can be the same. However, it is also conceivable that the first side is encapsulated with a first material and the second side is encapsulated with a second material which is different from the first material.

One advantageous development of the disclosure is that the printed circuit board is arranged on a base plate via an intermediate layer, where the intermediate layer is arranged between the second side and the base plate. The intermediate layer can be formed as a thermally conductive adhesive and/or as a laminate and/or as a no-flow prepreg. The base plate may be formed from aluminum, so that heat can be dissipated via the base plate. The base plate can therefore also be regarded and/or formed as a heat sink.

In some examples, a cutout and/or an opening are provided in the base plate and in the intermediate layer, so that access to the contact points of the second conductor loop and/or, in the case of a through-plating of the first conductor loop, access to the contact points of the first conductor loop is provided via this cutout in order to be able to measure the resistance of the first conductor loop and/or the second conductor loop.

It is conceivable that the contact points of the first conductor loop which is formed on the first side of the printed circuit board are accessible from the first side in order to have an electrical voltage applied to them. For this purpose, it is provided that the encapsulation is recessed in the region of the contact points of the first conductor loop on the first side of the printed circuit board, so that the contact points are accessible and can have an electrical voltage applied to them for a four-point resistance measurement.

In some implementations, the contact points of the first and/or second conductor loop can have an electrical voltage applied to them via a plug-in connector and/or a plug of the printed circuit board in order to determine the respective line resistance of the first conductor loop and/or second conductor loop. In this way, in addition to making electrical contact with the printed circuit board via the plug-in connector, electrical contact can be made with the first and/or second conductor loop in order to detect the line resistance of the first and/or second conductor loop.

In some examples, the first conductor loop and the second conductor loop can be designed in such a way that a resistance, specifically a line resistance, can be determined via the respective conductor loop. In addition, the conductor loop has to be corrodible with respect to the medium surrounding the control device, so that the line resistance of the respective conductor loop can change if the medium reaches the conductor loop via a gap between the encapsulation and the printed circuit board. One advantageous development of the disclosure is that the first conductor loop and/or the second conductor loop contain/contains silver, brass, copper and/or a silver alloy. Silver, brass, copper and/or a silver alloy can be attacked, for example, by an oil, so that conductor loops which are formed in this way change their line resistance when they come into contact with oil. The resistance of the first conductor loop and/or the second conductor loop can be determined in a simple manner via a four-point resistance measurement. Copper is inexpensive compared to silver, and therefore the cost of the control device can be reduced.

In some implementations, it is provided that a width and/or thickness of the first conductor loop and/or the second conductor loop are/is less than 500 μm, such as less than 250 μm and for example less than 100 μm. The smaller the cross section, the width or the thickness of the first conductor loop or second conductor loop, the more sensitive the resistance of the conductor loop is, so that extremely small irregularities can be detected. In addition, material and costs can be reduced with a reduced conductor loop cross section.

In some examples, it is provided that a plurality of first conductor loops which are arranged at a distance from one another are arranged on the first side, and/or a plurality of second conductor loops which are arranged at a distance from one another are arranged on the second side. This means that, for example, two or three or even more first conductor loops are arranged and/or formed next to one another on the first conductor side, where a distance is formed between these individual first conductor loops in each case. The distance between the first conductor loops on the first side is greater than 100 μm and less than 750 μm, for example greater than 150 μm and less than 500 μm, where the limits are included. The resistance of each individual first conductor loop is recorded and monitored. The same form and/or design also applies to the second conductor loops which are arranged on the second side. In this way, a progress of damage to the adhesive bond between the encapsulation and the first side can be detected in a direction parallel to the plane of the printed circuit board, for example by measuring the resistance of the first conductor loops, which are arranged next to one another. The same applies to the second side of the printed circuit board. Depending on the change in the resistance of the first conductor loops and/or second conductor loops in a direction parallel to the plane of the printed circuit board, damage to the adhesive bond between the encapsulation and the printed circuit board can be indicated. If, for example, the adhesive bond between the encapsulation and the printed circuit board is weakened only in the edge region, so that a corrosive medium enters via a gap between the encapsulation and the printed circuit board and causes a change in the resistance of the first conductor loop which is at the smallest distance from the edge, for example, a signal indicating that the control device should be checked at the next maintenance interval can be output. If the adhesive bond between the encapsulation and the printed circuit board has progressed to such an extent that the first conductor loops which face the electronic module have an increased resistance, a signal and/or a message indicating that a workshop should be visited as soon as possible to check the control device can be output. In this way, the risk of the control device failing suddenly without warning can be reduced.

In some implementations, the control device is formed without a housing. In other words, the printed circuit board with the electronic components arranged on it is not surrounded by a housing part, which has housing walls, in order to protect the electronic components from external influences. Rather, the control device or the printed circuit board of the control device with the electronic components arranged on it is protected against external media by the encapsulation. Due to the design without a housing, both the production costs for the control device and the installation space for the control device can be reduced.

The disclosure additionally relates to a motor vehicle that includes the control device according to the disclosure.

In some implementations, a warning signal can be outputted when there is a change in the resistance of the first conductor loop and/or the second conductor loop. In other words, a driver of the motor vehicle can be informed about a detected change in the resistance of the first conductor loop and/or the second conductor loop via a corresponding signal, so that a workshop can be visited in good time in order to replace the defective control device at an early stage.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
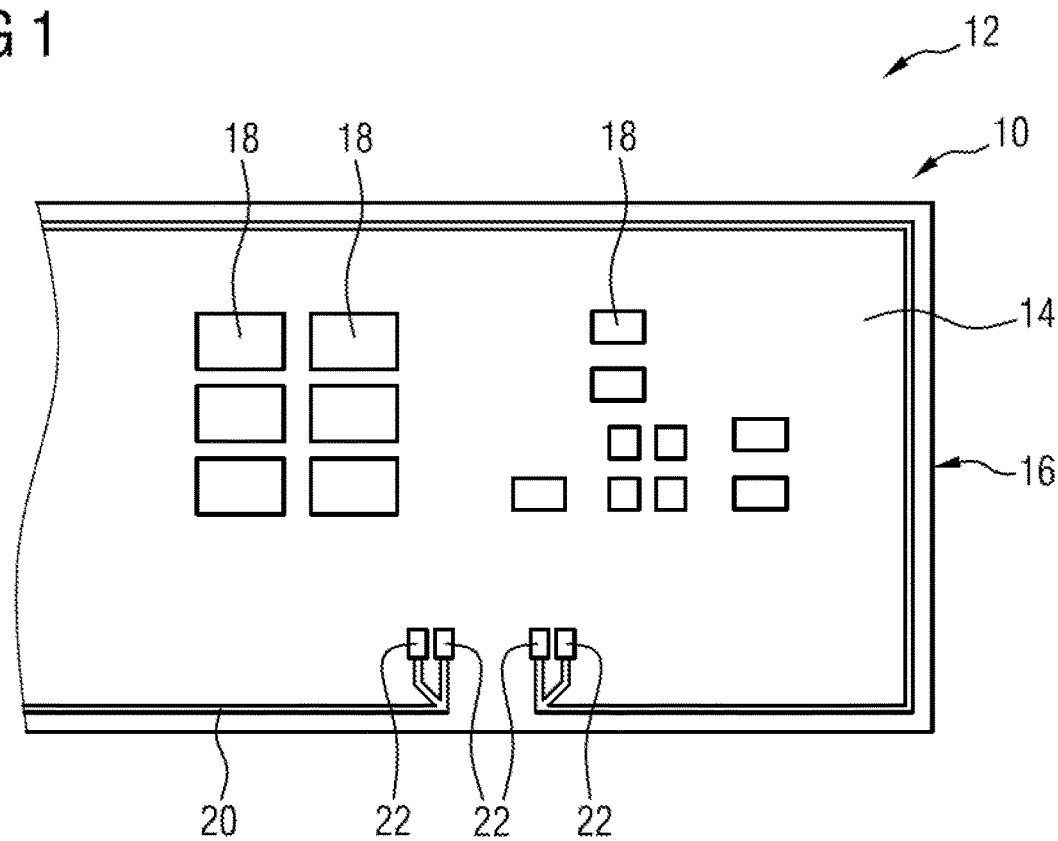
FIG. 1 shows a plan view of an exemplary printed circuit board of a control device.

FIG. 1 shows a plan view of a printed circuit board 10 of a control device 12 for a motor vehicle. The printed circuit board 10 has a first side 14 and an edge 16. The first side 14 is, for example, the top side of the printed circuit board 10. The edge 16 delimits the first side 14 of the printed circuit board 10 or the printed circuit board 10. In other words, the edge 16 is an outer border of the printed circuit board 10. A plurality of electronic components 18 are arranged on the first side 14 of the printed circuit board 10. The electronic components 18 are both mechanically and electrically conductively connected to the printed circuit board 10. Furthermore, it can be seen that a first conductor loop 20 which is formed as a resistor is arranged on the first side 14 of the printed circuit board 10, where the first conductor loop 20 is arranged between the edge 16 of the printed circuit board 10 and the electronic components 18. In other words, a distance between the edge 16 and the first conductor loop 20 in a direction parallel to the plane of the printed circuit board 10 is smaller than a corresponding distance between the edge 16 and an electronic component 18.

The first conductor loop 20 is designed as an open conductor loop and has four contact points 22 for a four-point resistance measurement. A four-point resistance measurement of a conductor loop is a known measurement method.

Figure 2:
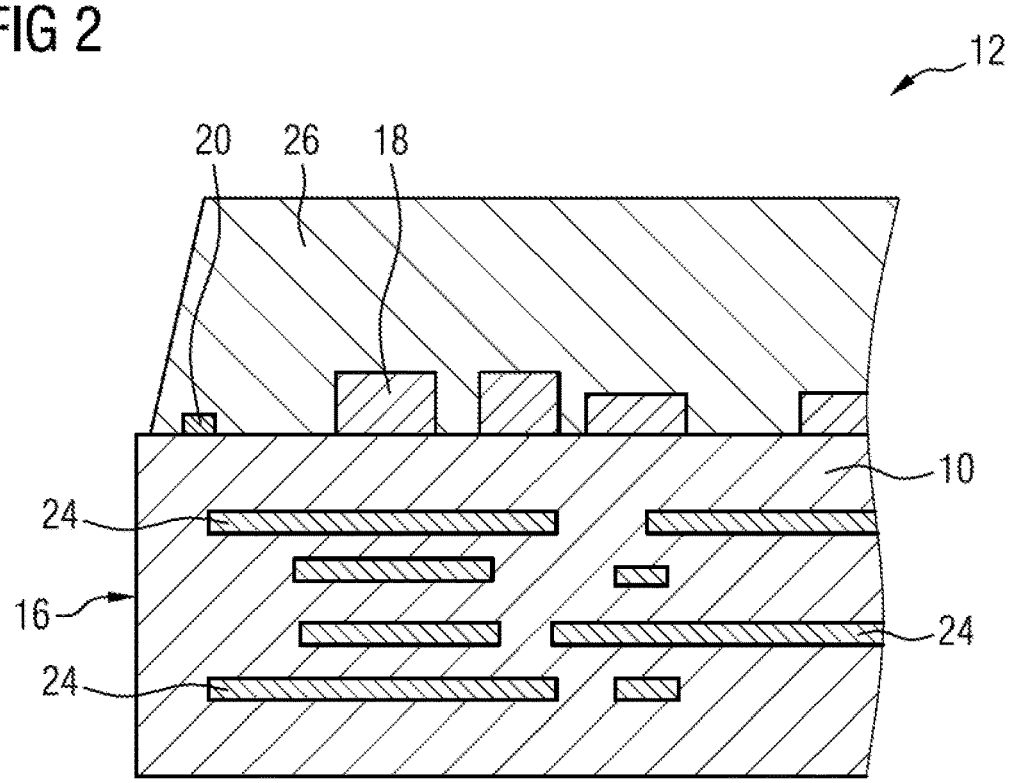
FIG. 2 shows a section through the exemplary printed circuit board of the control device shown in FIG. 1.

FIG. 2 shows a section through the printed circuit board 10 of the control device 12 shown in FIG. 1. The printed circuit board 10 is formed as a multilayer printed circuit board and has a plurality of conductor tracks 24, which are arranged at a distance from one another, in a direction perpendicular to the plane of the printed circuit board 10. The electronic components 18 are arranged on the first side 14 of the printed circuit board 10 and the first conductor loop 20 is formed close to the edge 16 of the first side 14 of the printed circuit board 10. An encapsulation 26 is arranged on the first side 14 of the printed circuit board 10, where the encapsulation 26 is also referred to as an "overmold". The encapsulation 26 is formed in such a way that at least the electronic components 18 and the first conductor loop 20 are encapsulated on the first side 14 of the printed circuit board 10. The encapsulation 26 can be, for example, a plastic, a synthetic resin or a resin. In this way, a contact-making connection with the electronic components 18 on the printed circuit board 10 should be protected against external media.

The first conductor loop 20 is at a reduced or smaller distance from the edge 16 in comparison to the electronic components 18. In this way, any leakage point resulting from a reduced adhesive bond between the encapsulation 26 and the first side 14 of the printed circuit board 10 can be detected by measuring the resistance of the first conductor loop 20 when a corrosive medium enters via this leakage point.

In general, the control device 12 is exposed to a corrosive medium, such as oil for example, which, if there is a leakage point between the encapsulation 26 and the first side 14 of the printed circuit board 10, enters a gap between the encapsulation 26 and the first side 14 and the first conductor loop 20, which is formed from copper for example, corrodes. As a result, the resistance of the first conductor loop 20 increases. Based on this resistance measurement and the change in the resistance of the first conductor loop 20, a signal which indicates damage to the control device 12 can be output, so that it can be replaced in good time before the contact-connection with the electronic components 18 on the printed circuit board 10 is damaged by the corrosive medium.

Figure 3:
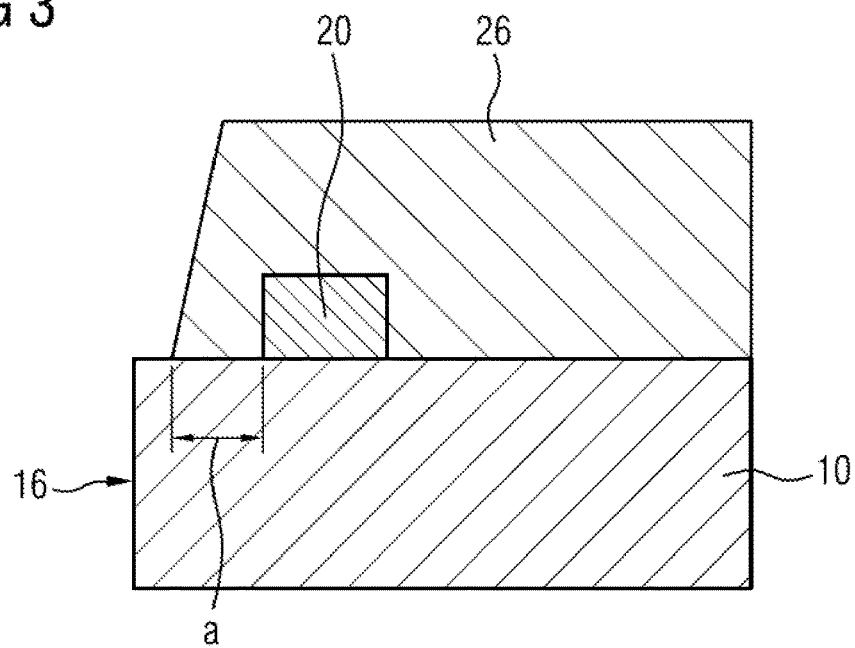
FIG. 3 shows a view of a detail of the section through the printed circuit board in an edge region of the printed circuit board.

FIG. 3 shows a detail of the printed circuit board 10 shown in FIG. 2 in the region of the first conductor loop 20. The first conductor loop 20 is arranged at a distance from the edge 16 on the first side 14 of the printed circuit board 10. The encapsulation 26 may be formed over the entire first side 14 in order to be able to form the greatest possible adhesive bond with the first side 14. However, it is not absolutely necessary for the encapsulation 26 to be applied to the entire first side 14. Rather, the encapsulation 26 can also be concentrated on the essential components 18 to be insulated. In this case, the encapsulation 26 should also be routed over the first conductor loop 20, so that it has a minimum material thickness a between the edge 16 and the first conductor loop 20. The minimum material thickness a is approximately 500 µm in the present example.

Figure 4:
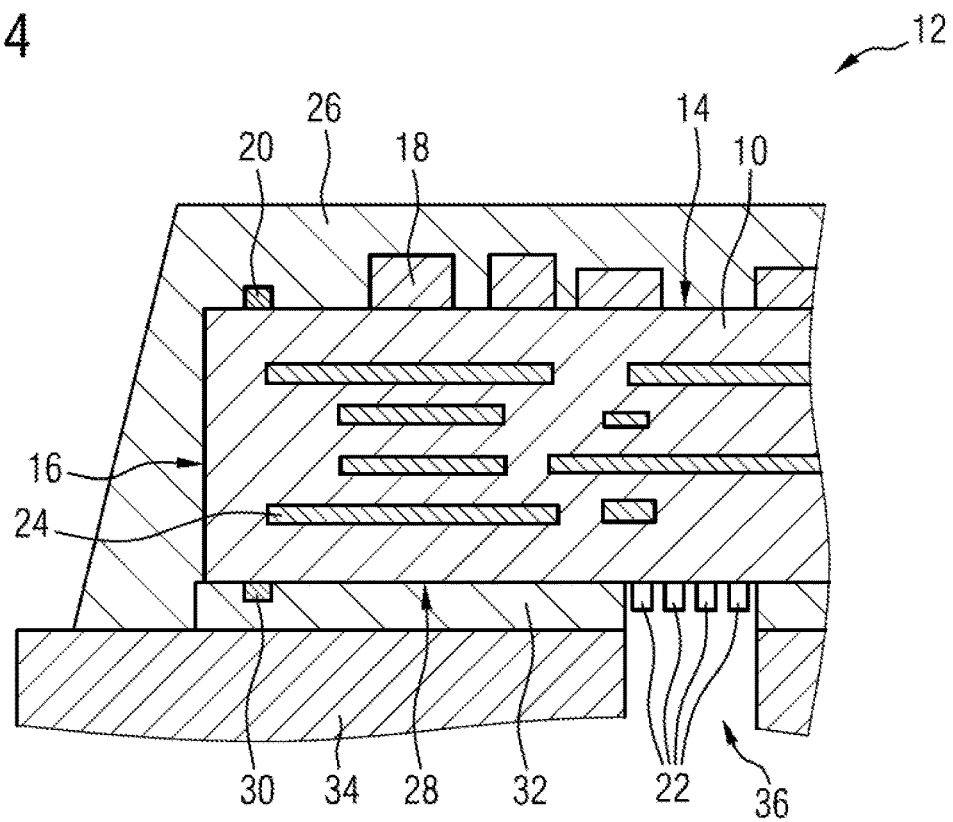
FIG. 4 shows an exemplary longitudinal section through the printed circuit board of the control device.

FIG. 4 shows a section through the printed circuit board 10 of control device 12 in another example. In addition to the printed circuit board 10 shown in FIG. 2, the printed circuit board 10 of FIG. 4 has a second side 28 which is arranged at a distance from the first side 14. A second conductor loop 30 is arranged on the second side 28. The second conductor loop 30 is formed at a distance from the edge 16 of the printed circuit board 10. The printed circuit board 10 is cohesively arranged on a base plate 34 via an intermediate layer 32 which is formed as a thermally conductive adhesive. The base plate 34 may be formed from aluminum and serves as a heat sink for the control device 12. Furthermore, it can be seen that the first conductor loop 20 is routed to the second side 28 by a through-plating, so that the resistance of the first conductor loop 20 can be measured starting from the second side 28. For this purpose, a corresponding opening 36 is provided in the base plate 34, via which opening access to the contact points 22 for measuring the line resistance of the first conductor loop 20 is made possible. It should be noted here that, although not shown, the second conductor loop 30 also has contact points for four-point resistance measurement on the second side 28 in the region of the opening 36.

The encapsulation 26 is not only arranged on the first side 14 of the printed circuit board 10, but is routed around the printed circuit board 10 down to the base plate 34. If the adhesive bond between the encapsulation 26 and the base plate 34 is then weakened and a corrosive medium enters between the encapsulation 26 and the base plate 34, the leakage point can be detected via the second conductor loop 30 in a first step in which the resistance of the second conductor loop 30 is checked and a change in resistance is detected. In this way, a possible failure of the control device 12 can be detected at an early stage, so that control device 12 can be replaced in good time.

Figure 5:
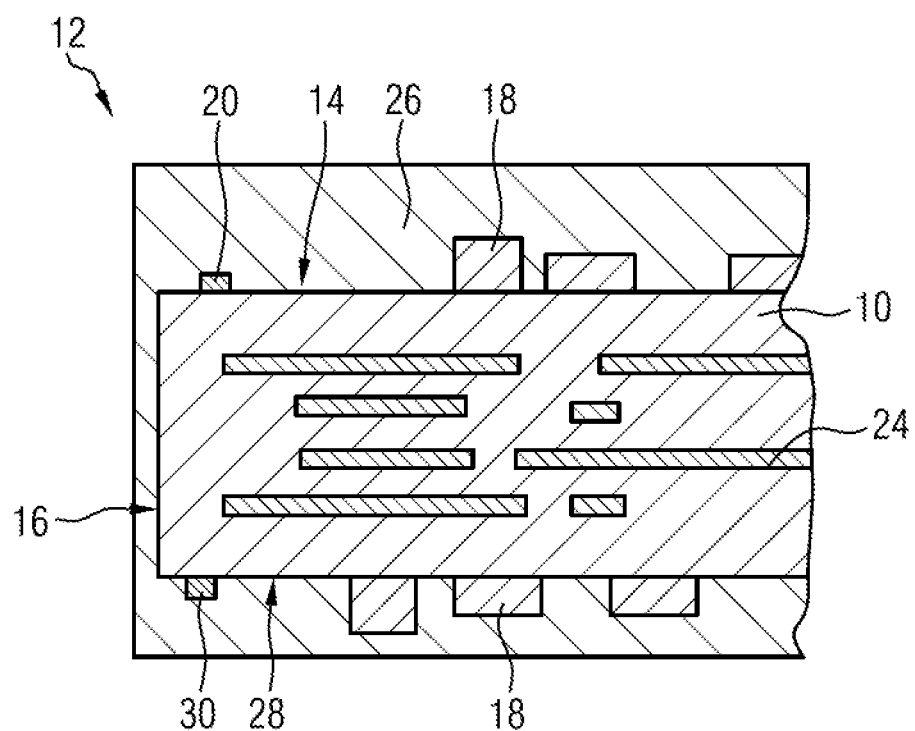
FIG. 5 shows another exemplary longitudinal section through the printed circuit board of the control device.

FIG. 5 shows a longitudinal section through the printed circuit board 10 according to another example. The printed circuit board 10 has a plurality of electronic components 18 both on the first side 14 and on the second side 28. The first conductor loop 20 is formed on the first side 14 at a distance from the edge 16. The second conductor loop 30 is arranged on the second side 28 at a distance from the edge 16. Both the first side 14 and the second side 28 of the printed circuit board 10 are protected against external media by an encapsulation 26. A voltage can be applied to the contact points 24 of the first conductor loop 20 and the second conductor loop 30 via a plug-in connector, not shown, of the printed circuit board 10 in order to be able to detect and/or determine the respective line resistance of the first conductor loop 20 and the second conductor loop 30.

A number of implementations have been described. Nevertheless, it will be understood that various modifications may be made without departing from the spirit and scope of the disclosure. Accordingly, other implementations are within the scope of the following claims.

What is claimed is:

1. A control device for a motor vehicle, the control device comprising:
   a printed circuit board having a first side, a second side, and an edge, the first side of the printed circuit board is delimited by the edge, the second side of the printed circuit board is arranged at a distance from the first side and is delimited by the edge;
   at least one electronic component arranged on the first side of the printed circuit board and is electrically conductively connected to the printed circuit board;
   a first conductor loop arranged on the first side of the printed circuit board, the first conductor loop arranged between the edge and the electronic component;
   a second conductor loop arranged at a distance from the edge on the second side of the printed circuit board; and
   an encapsulation of the printed circuit board, the encapsulation surrounding at least the first side, the at least one electronic component and the first conductor loop.

2. The control device of claim 1, wherein the first conductor loop is open and is wired by a through-plating for a four-point resistance measurement.

3. The control device of claim 1, wherein the printed circuit board is arranged on a base plate via an intermediate layer, the intermediate layer arranged between the second side and the base plate.

4. The control device of claim 1, wherein a plurality of first conductor loops arranged at a distance from one another are arranged on the first side, and/or a plurality of second conductor loops arranged at a distance from one another are arranged on the second side.

5. The control device of claim 1, wherein the first conductor loop and/or the second conductor loop contain/contains silver, brass, copper and/or a silver alloy.

6. The control device of claim 1, wherein a width and/or thickness of the first conductor loop and/or the second conductor loop are/is less than 500 μm.

7. The control device of claim 1, wherein the control device is formed without a housing.

8. The control device of claim 1, wherein the first conductor loop and/or second conductor loop include contact point having an electrical voltage applied to them via a plug-in connector and/or a plug of the printed circuit board to detect and/or to determine the respective line resistance of the first conductor loop and/or the second conductor loop.

9. A motor vehicle comprising a control device as claimed in claim 1.

10. The motor vehicle of claim 9, wherein a warning signal is outputted when there is a change in a resistance of the first conductor loop and/or a second conductor loop.

* * * * *